United States Patent
Yoshida et al.

(10) Patent No.: US 9,550,916 B2
(45) Date of Patent: Jan. 24, 2017

(54) SILICONE MATERIAL, CURABLE SILICONE COMPOSITION, AND OPTICAL DEVICE

(71) Applicant: Dow Corning Toray Co., Ltd., Tokyo (JP)

(72) Inventors: Shin Yoshida, Ichihara (JP); Tomohiro Iimura, Ichihara (JP)

(73) Assignee: DOW CORNING TORAY CO., LTD., Chiyoda-ku, Tokyo (JP)

( * ) Notice: Subject to any disclaimer, the term of this patent is extended or adjusted under 35 U.S.C. 154(b) by 0 days.

(21) Appl. No.: 15/079,164

(22) Filed: Mar. 24, 2016

(65) Prior Publication Data

US 2016/0289499 A1   Oct. 6, 2016

(30) Foreign Application Priority Data

Mar. 30, 2015   (JP) .................................. 2015-070211

(51) Int. Cl.
| | | |
|---|---|---|
| C09D 183/04 | (2006.01) | |
| C08G 77/20 | (2006.01) | |
| H01L 33/56 | (2010.01) | |
| H01L 33/62 | (2010.01) | |

(52) U.S. Cl.
CPC .............. C09D 183/04 (2013.01); C08G 77/20 (2013.01); H01L 33/56 (2013.01); H01L 33/62 (2013.01)

(58) Field of Classification Search
CPC ....... C09D 183/04; C08G 77/20; H01L 33/56; H01L 33/62
See application file for complete search history.

(56) References Cited

U.S. PATENT DOCUMENTS

| | | | | |
|---|---|---|---|---|
| 4,418,165 A | * | 11/1983 | Polmanteer | G02B 1/04 523/107 |
| 6,268,416 B1 | * | 7/2001 | Hirai | C08K 5/5419 524/265 |
| 6,710,377 B2 | * | 3/2004 | Shimomura | H01L 33/56 257/100 |
| 2006/0142472 A1 | * | 6/2006 | Hirai | C08K 3/36 524/588 |

FOREIGN PATENT DOCUMENTS

JP   2002-314139 A   10/2002

OTHER PUBLICATIONS

English language abstract for JP 2002-314139 extracted from espacenet.com database on Mar. 28, 2016, 2 pages.

* cited by examiner

Primary Examiner — Karen Kusumakar
(74) Attorney, Agent, or Firm — Howard & Howard Attorneys PLLC

(57) ABSTRACT

This invention relates to a silicone material satisfying any of the following conditions in an elemental composition percentage of the silicone material surface according to X-ray photoelectron spectroscopy (ESCA): (i) the elemental composition percentage of carbon atoms is from 50.0 to 70.0 atom %; (ii) a ratio of the elemental composition percentage of carbon atoms to the elemental composition percentage of silicon atoms (C/Si) is from 2.0 to 5.0; or (iii) both of the above conditions (i) and (ii). The silicone material is stable against light and heat, in which a decrease in transmittance and generation of cracks do not tend to occur.

12 Claims, 1 Drawing Sheet

SILICONE MATERIAL, CURABLE SILICONE COMPOSITION, AND OPTICAL DEVICE

CROSS-REFERENCE TO RELATED APPLICATIONS

This application claims priority to and all the advanages of Japanese Patent Applicaiton No. JP2015-070211, filed on Mar. 30, 2015, the content of which is incorporated herein by reference.

TECHNICAL FIELD

The present invention relates to a silicon material, a curable silicone composition for forming the silicone material, and an optical device containing the silicone material.

BACKGROUND ART

Silicone materials are used as lens materials or sealing materials of light emitting diodes (LEDs) due to their excellent transparency, heat resistance and weather resistance (refer to Patent Document 1).

However, with the recent increase in brightness of LEDs, it has been found that problems such as a decrease in transparency and generation of cracks occur despite it being a silicone material.

PRIOR ART DOCUMENTS

Patent Documents

Patent Document 1: Japanese Unexamined Patent Application Publication No. 2002-314139

SUMMARY OF INVENTION

Technical Problem

An object of the present invention is to provide a silicone material that is stable against light and heat, in which a decrease in transmittance and cracking do not tend to occur. Other objects of the present invention are to provide a curable silicone composition which forms such a silicone material, and to provide an optical device having excellent reliability which uses such a silicone material.

Solution to Problem

The silicone material of the present invention has the characteristic that it satisfies any of the following conditions in an elemental composition percentage of the silicone material surface according to X-ray photoelectron spectroscopy (ESCA):
(i) the elemental composition percentage of carbon atoms is from 50.0 to 70.0 atom %;
(ii) a ratio of the elemental composition percentage of carbon atoms to the elemental composition percentage of silicon atoms (C/Si) is from 2.0 to 5.0; or
(iii) both of the above conditions (i) and (ii).
This silicone material preferably contains an Si—$R^1$—Si bond (wherein $R^1$ is an alkylene group or an arylene group) in its structure, and this silicone material is preferably an optical material, particularly a sealing material of an optical element.

The curable silicone composition of the present invention has the characteristics that it cures to form such a silicone material described above, and is a composition comprising: an organopolysiloxane having at least two silicon-bonded alkenyl groups and at least one silicon-bonded aryl group in a molecule; an organopolysiloxane having at least two silicon-bonded hydrogen atoms in a molecule; and a hydrosilylation-reaction catalyst.

The optical device of the present invention has the characteristic that it is formed by sealing an optical element with the above silicone material, and preferably, that the above optical element is an LED.

Effect of Invention

The silicone material of the present invention has the characteristic that it is stable against light and heat, and a decrease in transmittance and generation of cracks do not tend to occur. Furthermore, the silicone composition of the present invention has the characteristic that it forms such a silicone material. Additionally, the optical device of the present invention is characterized by having excellent reliability.

DETAILED DESCRIPTION OF THE INVENTION

Figure 1:
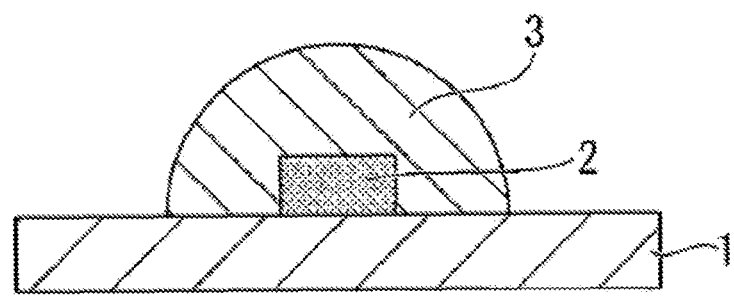
FIG. 1 is a cross-sectional view of a chip-on-board (COB) LED device that is an example of the optical device of the present invention.

[Silicone Material]
The silicone material of the present invention has the characteristic that it satisfies any of the following conditions in the elemental composition percentage of the silicone material surface according to X-ray photoelectron spectroscopy (ESCA):
(i) the elemental composition percentage of carbon atoms is from 50.0 to 70.0 atom %;
(ii) the ratio of the elemental composition percentage of carbon atoms to the elemental composition percentage of silicon atoms (C/Si) is from 2.0 to 5.0; or
(iii) both of the above conditions (i) and (ii).
The proportion of carbon atoms in the atomic composition percentage of the silicone material surface according to X-ray photoelectron spectroscopy (ESCA) is from 50.0 to 70.0 atom %, and preferably from 60.0 to 68.0 atom %. This is because when the proportion of carbon atoms is not less than the minimum value of the range given above, the silicone material is stable against light and heat and a decrease in transmittance of the silicone material tends not to occur, and a highly durable LED device can be produced. On the other hand, when it is not greater than the maximum value of the range given above, generation of cracks in the silicone material tends not to occur, and a highly durable LED device can be produced.

Furthermore, the ratio of the elemental composition percentage of carbon atoms to the elemental composition percentage of silicon atoms (C/Si) in the atomic composition percentage according to X-ray photoelectron spectroscopy (ESCA) of the silicone material surface is from 2.0 to 5.0, and preferably from 3.0 to 4.5. This is because if this ratio (C/Si) is not less than the minimum value of the range given above, generation of cracks can be suppressed due to high toughness being imparted, and on the other hand, if it is not greater than the maximum value of the range given above, composition degradation due to light and heat can be suppressed.

Furthermore, the silicone material preferably has an Si—$R^1$—Si bond in its structure. This is because a silicone material having such a bond can mitigate degradation due to light and heat as well as damage due to internal pressure occurring when an LED is repeatedly turned on and off.

In the formula, $R^1$ is an alkylene group or an arylene group. Examples of the alkylene group include alkylene groups having from 2 to 12 carbons, such as a methylmethylene group, an ethylene group, a propylene group, a methylethylene group, a butylene group, and an isobutylene group. Examples of the arylene group include arylene groups having from 6 to 12 carbons, such as a phenylene group, a tolylene group, a xylylene group, and a naphthylene group.

The shape of such a silicone material of the present invention is not particularly limited, and examples include a sheet shape, a film shape, a fiber shape, a board shape, a spherical shape, a hemispherical shape, a convex lens shape, a concave lens shape, a Fresnel lens shape, a round pillar shape, and a round cylindrical shape. The silicone material of the present invention may stand alone, but, for example, it may also be used as a sealing material, an adhesive material, or a covering material of a light-emitting element in an optical device, and may also be used as a lens in an optical device or as a protecting material or a condenser lens in a solar cell.

[Curable Silicone Composition]

The curing mechanism of the curable silicone composition that forms the silicone material of the present invention is not particularly limited, and examples include an addition reaction, a condensation reaction, and a radical reaction. An addition reaction is preferred.

The curable silicone composition that has been cured by an addition reaction comprises: an organopolysiloxane having at least two silicon-bonded alkenyl groups and at least one silicon-bonded aryl group in a molecule; an organopolysiloxane having at least two silicon-bonded hydrogen atoms in a molecule; and a hydrosilylation-reaction catalyst. As such a curable silicone composition, one comprising the following is preferred:

(A) an organopolysiloxane represented by the average composition formula:

wherein $R^2$ are each independently an alkyl group having from 1 to 12 carbons, an alkenyl group having from 2 to 12 carbons, an aryl group having from 6 to 20 carbons, or an aralkyl group having from 7 to 20 carbons, wherein alkenyl groups account for 1 to 20 mol % of all $R^2$, aryl groups account for at most 40 mol % of all $R^2$, and "a" is a number satisfying the relationship 1≤a<2;

(B) an organopolysiloxane having at least two silicon-bonded hydrogen atoms in the molecule, in an amount such that the amount of silicon-bonded hydrogen atoms in this component is from 0.1 to 5 moles per 1 mole of total alkenyl groups in component (A); and (C) a hydrosilylation reaction catalyst, in an amount such that it accelerates curing of the present composition.

Component (A) is a main component of the present composition, and is an organopolysiloxane represented by the average composition formula:

In the formula, $R^2$ are each independently an alkyl group having from 1 to 12 carbons, an alkenyl group having from 2 to 12 carbons, an aryl group having from 6 to 20 carbons, or an aralkyl group having from 7 to 20 carbons. Specific examples include alkyl groups such as a methyl group, an ethyl group, a propyl group, a butyl group, a pentyl group, a hexyl group, a heptyl group, an octyl group, a nonyl group, a decyl group, an undecyl group, and a dodecyl group; alkenyl groups such as a vinyl group, an allyl group, a butenyl group, a pentenyl group, a hexenyl group, a heptenyl group, an octenyl group, a nonenyl group, a decenyl group, an undecenyl group, and a dodecenyl group; aryl groups such as a phenyl group, a tolyl group, a xylyl group, a naphthyl group, an anthracenyl group, a phenanthryl group, and a pyrenyl group; aralkyl groups such as a naphthylethyl group, a naphthylpropyl group, an anthracenylethyl group, a phenanthrylethyl group, and a pyrenylethyl group; and groups in which hydrogen atoms of these aryl groups or aralkyl groups are substituted with alkyl groups such as a methyl group or an ethyl group, alkoxy groups such as a methoxy group or an ethoxy group, or halogen atoms such as a chlorine atom or a bromine atom. Furthermore, in the above formula, from 1 to 20 mol %, preferably from 1 to 15 mol %, or 2 to 15 mol % of all $R^2$ are the above alkenyl groups. This is because when the content of alkenyl groups is not less than the minimum value of the range given above, the present composition is satisfactorily cured, and on the other hand, when the content of alkenyl groups is not greater than the maximum value of the range given above, the physical properties of the cured product obtained by curing the present composition are good. Furthermore, at most 40 mol %, preferably at most 35 mol %, or at most 30 mol % of all $R^2$ are the above aryl groups, and on the other hand, at least 1 mol %, at least 5 mol %, or at least 10 mol % of all $R^2$ are the above aryl groups. This is because when the content of aryl groups is not greater than the maximum value of the range given above, the heat resistance of the cured product obtained by curing the present composition is good and reliability of an optical device in which the optical element is sealed with the present composition can be improved. On the other hand, when the content of aryl groups is not less than the maximum value of the range given above, the light-emitting efficiency of an optical device in which the optical element is sealed with the present composition can be improved.

In the formula, "a" is a number satisfying the relationship 1≤a<2, preferably, a number satisfying the relationship 1.2≤a<2, a number satisfying the relationship 1.3≤a<2, or a number satisfying the relationship 1.4≤a<2. This is because when "a" is not less than the minimum value of the range given above, the reliability of an optical device in which the optical element is sealed with the present composition can be improved. On the other hand, when "a" is not greater than the maximum value of the range given above, the physical properties of the cured product obtained by curing the present composition are good.

The molecular structure of component (A) is exemplified by linear, partially branched linear, branched chain, cyclic, and dendritic structures, and is preferably a linear, partially branched linear, or dendritic structure. Component (A) may be a mixture of two or more types of organopolysiloxanes having these molecular structures.

Component (B) is a crosslinking agent of the present composition and is an organopolysiloxane having at least two silicon-bonded hydrogen atoms in a molecule. The molecular structure of component (B) is exemplified by linear, partially branched linear, branched chain, cyclic, and dendritic structures, and is preferably a linear, partially branched linear, or dendritic structure. The bond positions of the silicon-bonded hydrogen atoms in component (B) are not limited, but examples are molecular terminals and/or side molecular chains. Examples of silicon-bonded groups other than a hydrogen atom in component (B) include alkyl groups such as a methyl group, an ethyl group, and a propyl group; aryl groups such as a phenyl group, a tolyl group, and a xylyl group; aralkyl groups such as a benzyl group and a phenethyl group; and halogenated alkyl groups such as a 3-chloropropyl group and a 3,3,3-trifluoropropyl group. Of these, a methyl group and a phenyl group are preferable. Although the viscosity of component (B) is not limited, the viscosity at 25° C. is preferably in the range of 1 to 10,000 mPa·s, and particularly preferably in the range of 1 to 1,000 mPa·s.

Examples of organopolysiloxanes for component (B) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-(3-glycidoxypropyl)-1,3,5,7-tetramethylcyclotetrasiloxane, 1,5-di(3-glycidoxypropyl)-1,3,5,7-tetramethylcyclotetrasiloxane, 1-(3-glycidoxypropyl)-5-trimethoxysilylethyl-1,3,5,7-tetramethylcyclotetrasiloxane, methylhydrogenpolysiloxanes capped at both molecular terminals with trimethylsiloxy groups, dimethylsiloxane-methylhydrogensiloxane copolymers capped at both molecular terminals with trimethylsiloxy groups, dimethylpolysiloxanes capped at both molecular terminals with dimethylhydrogensiloxy groups, dimethylsiloxane-methylhydrogensiloxane copolymers capped at both molecular terminals with dimethylhydrogensiloxy groups, methylhydrogensiloxane-diphenylsiloxane copolymers capped at both molecular terminals with trimethylsiloxy groups, methylhydrogensiloxane-diphenylsiloxane-dimethylsiloxane copolymers capped at both molecular terminals with trimethylsiloxy groups, hydrolysis/condensation reaction products of trimethoxysilane, copolymers comprising a $(CH_3)_2HSiO_{1/2}$ unit and an $SiO_{4/2}$ unit, copolymers comprising a $(CH_3)_2HSiO_{1/2}$ unit, an $SiO_{4/2}$ unit, and a $(C_6H_5)SiO_{3/2}$ unit, and mixtures of two or more thereof.

Examples of component (B) also include the following organopolysiloxanes. Note that in the formulae, Me and Ph denote a methyl group and a phenyl group, respectively, "m" is an integer from 1 to 100, "n" is an integer from 1 to 50, and "b", "c", "d", and "e" are each positive numbers where the total of "b", "c", "d", and "e" in a molecule is 1.

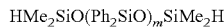

$HMe_2SiO(Ph_2SiO)_mSiMe_2H$

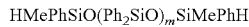

$HMePhSiO(Ph_2SiO)_mSiMePhH$

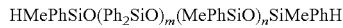

$HMePhSiO(Ph_2SiO)_m(MePhSiO)_nSiMePhH$

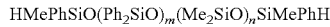

$HMePhSiO(Ph_2SiO)_m(Me_2SiO)_nSiMePhH$

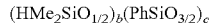

$(HMe_2SiO_{1/2})_b(PhSiO_{3/2})_c$

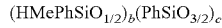

$(HMePhSiO_{1/2})_b(PhSiO_{3/2})_c$

$(HMePhSiO_{1/2})_b(HMe_2SiO_{1/2})_c(PhSiO_{3/2})_d$

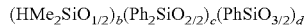

$(HMe_2SiO_{1/2})_b(Ph_2SiO_{2/2})_c(PhSiO_{3/2})_d$

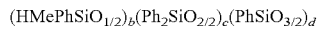

$(HMePhSiO_{1/2})_b(Ph_2SiO_{2/2})_c(PhSiO_{3/2})_d$

$(HMePhSiO_{1/2})_b(HMe_2SiO_{1/2})_c(Ph_2SiO_{2/2})_d(PhSiO_{3/2})_e$

The content of component (B) per 1 mole of total alkenyl groups in component (A) is in a range such that the amount of silicon-bonded hydrogen atoms in component (B) is in a range from 0.1 to 5 mol, and preferably in a range from 0.5 to 2 mol. This is because when the content of component (B) is not less than the minimum value of the range given above, the obtained composition is satisfactorily cured, and on the other hand, when the content of component (B) is not greater than the maximum value of the range given above, heat resistance of the silicone material is improved.

Component (C) is a hydrosilylation reaction catalyst for accelerating the curing of the present composition, and examples include platinum-based catalysts, rhodium-based catalysts, and palladium-based catalysts, among which platinum-based catalysts are preferred. This platinum-based catalyst is a platinum-based compound exemplified by platinum fine powder, platinum black, platinum-supporting silica fine powder, platinum-supporting activated carbon, chloroplatinic acid, chloroplatinic acid alcohol solutions, olefin complexes of platinum, alkenylsiloxane complexes of platinum, and the like.

The amount of component (C) is an amount that accelerates curing of the present composition, and is preferably an amount such that the amount of metal atoms in the catalyst is in the range of 0.01 to 1,000 ppm by mass relative to the present composition. This is because when the amount of component (C) is less than the minimum value of the range given above, there is a risk that curing of the obtained composition will not be sufficient, and on the other hand, when the amount exceeds the maximum value of the range given above, curing is not noticeably more accelerated, and moreover, there is a risk that problems such as discoloration of the cured product will occur.

The present composition may include a hydrosilylation reaction inhibitor (D) as an optional component for prolonging usable life at room temperature and improving storage stability. Examples of component (D) include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; enyne compounds such as 3-methyl-3-penten-1-yne and 3,5-dimethyl-3-hexen-1-yne; methylalkenylsiloxane oligomers such as 1,3,5,7-tetramethyl-1,3,5,7-tetravinylcyclotetrasiloxane and 1,3,5,7-tetramethyl-1,3,5,7-tetrahexenylcyclotetrasiloxane; alkynoxysilanes such as dimethyl bis(1,1-dimethyl-3-propyn-oxy)silane and methylvinyl bis(1,1-dimethyl-3-propyn-oxy)silane, and triallylisocyanurate compounds.

There is no limitation on the content of component (D), but it is preferably in the range of 0.01 to 3 parts by mass, or in the range of 0.01 to 1 parts by mass, relative to 100 parts by mass of the total of components (A) to (C). This is because when the content of component (D) is not less than the minimum value of the range given above, the present composition has an adequate usable life, and on the other hand, when the content of component (D) is not greater than the maximum value of the range given above, it has adequate ease of handling.

The present composition may also contain an adhesion-imparting agent (E) for improving the adhesion of the composition. Preferred component (E) are organosilicon compounds having at least one silicon-bonded alkoxy group in a molecule. This alkoxy group is exemplified by a methoxy group, an ethoxy group, a propoxy group, a butoxy group, and a methoxyethoxy group, among which a methoxy group is particularly preferred. Moreover, silicon-bonded groups other than alkoxy groups in component (E) are exemplified by halogen-substituted or unsubstituted monovalent hydrocarbon groups such as alkyl groups, alkenyl groups, aryl groups, aralkyl groups, halogenated alkyl groups and the like; glycidoxyalkyl groups such as a 3-glycidoxypropyl group, a 4-glycidoxybutyl group, and the like; epoxycyclohexylalkyl groups such as a 2-(3,4-epoxycyclohexyl)ethyl group, a 3-(3,4-epoxycyclohexyl)propyl group, and the like; epoxyalkyl groups such as a 3,4-epoxybutyl group, a 7,8-epoxyoctyl group, and the like; acrylic group-containing monovalent organic groups such as a 3-methacryloxypropyl group and the like; and a hydrogen atom. Component (E) preferably contains a group that can react with the alkenyl groups or silicon-bonded hydrogen atoms in the present composition. Specifically, component (E) preferably contains a silicon-bonded hydrogen atom or an alkenyl group. Moreover, due to the ability to impart good adhesion to various types of substrates, component (E) preferably has at least one epoxy group-containing monovalent organic group in a molecule. This type of component (E) is exemplified by organosilane compounds, organosiloxane oligomers, and alkyl silicates. The molecular structure of the organosiloxane oligomer or alkyl silicate is exemplified by linear, partially branched linear, branched chain, cyclic, and net-shaped structures. Linear, branched chain, and net-shaped structures are particularly preferred. Component (E) is exemplified by silane compounds such as 3-glycidoxypropyltrimethoxysilane, 2-(3,4-epoxycyclohexyl)ethyltrimethoxysilane, 3-methacryloxypropyltrimethoxysilane, and the like; siloxane compounds having at least one each of silicon-bonded alkenyl groups or silicon-bonded hydrogen atoms and silicon-bonded alkoxy groups in a molecule; mixtures of a silane compound or siloxane compound having at least one silicon-bonded alkoxy group and a siloxane compound having at least one silicon-bonded hydroxyl group and at least one silicon-bonded alkenyl group in a molecule; and methyl polysilicate, ethyl polysilicate, and epoxy group-containing ethyl polysilicate. Component (E) is preferably a low-viscosity liquid, and its viscosity is not particularly limited but is preferably from 1 to 500 mPa·s at 25° C. In the present composition, the content of component (E) is not particularly limited, but is preferably in a range of 0.01 to 10 parts by mass per total of 100 parts by mass of the composition.

Moreover, an inorganic filler such as silica, glass, alumina or zinc oxide; an organic resin fine powder of a polymethacrylate resin and the like; a fluorescent substance, a heat-resistant agent, a dye, a pigment, a flame retardant, a solvent and the like may be included as optional components in the present composition as long as they do not impair the object of the present invention.

The present composition is such that curing occurs either at room temperature or under heating, but it is preferable to heat the composition in order to achieve rapid curing. The heating temperature is preferably in a range of 50 to 200° C.

[Optical Device]

The optical device of the present invention has the characteristic that it is formed by sealing an optical element with the above silicone material. The optical element in the optical device of the present invention may be a photocoupler, light-emitting diode, solid-state image sensor, or the like. The optical element is preferably the light-emitting diode. Such an optical device of the present invention will be described in detail using FIGS. 1 and 2.

FIG. 1 illustrates a cross-sectional view of a chip-on-board (COB) LED that is an example of the optical device of the present invention. In the COB LED device of FIG. 1, an LED 2 is mounted on a COB substrate 1 by die bonding, and the LED 2 is sealed with a silicone material 3. Furthermore, a light reflection material (not illustrated) may be formed surrounding the LED 2 on the substrate 1 such that light emitted from the LED 2 is efficiently reflected.

Figure 2:
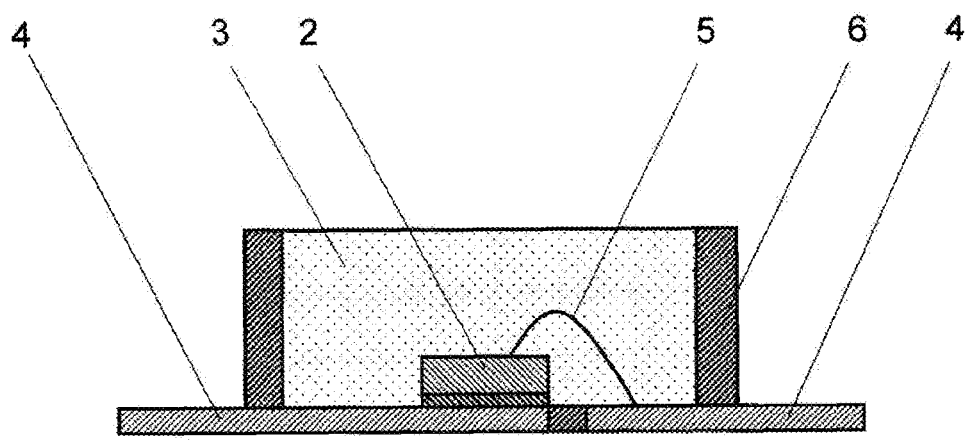
FIG. 2 is a cross-sectional view of another LED device that is an example of the optical device of the present invention.

FIG. 2 illustrates a cross-sectional view of another LED device that is an example of the optical device of the present invention. In the LED device of FIG. 2, the LED 2 is mounted on a lead frame 4' by die bonding, and is electrically connected to a lead frame 4 by a bonding wire 5. The LED 2 is sealed with a silicone material 3. Furthermore, a light reflection material 6 is formed surrounding the LED 2 on the lead frames 4, 4' such that light emitted from the LED 2 is efficiently reflected.

In the LED device of FIG. 1, the substrate 1 may be a metal substrate made of aluminum, copper, or the like, and on the surface of the metal substrate, circuits are formed with an insulation layer (not illustrated) interposed. Furthermore, when a non-metal substrate is used as the substrate 1, forming an insulation layer is unnecessary. Examples of such non-metal substrates include glass epoxy substrates, polybutylene terephthalate (PBT) substrates, polyimide substrates, polyester substrates, aluminum nitride substrates, boron nitride substrates, silicon nitride substrates, alumina ceramic substrates, glass substrates, and flexible glass substrates. Additionally, hybrid substrates made from an aluminum substrate or copper substrate having an insulating resin layer, printed silicon substrates, silicon carbide substrates, and sapphire substrates may also be used as the substrate 1.

In the LED device of FIG. 2, for the lead frames 4, 4', at least one type of metal selected from the group consisting of silver, copper, and aluminum, which have high electrical conductivity, or an alloy containing at least one type of metal selected from the group consisting of silver, copper, and aluminum is used. Additionally, a light reflection material 6 is preferably formed on the lead frames 4, 4' so as to expose the portion where the LED 2 is mounted.

FIG. 1 depicts only one LED 2 on the substrate 1, but a plurality of LEDs 2 may be mounted on the substrate 1.

EXAMPLES

The silicone material, the curable silicone composition, and the optical device of the present invention will now be described in detail using practical examples.

<Measurement of Atomic Composition Percentage of Surface by X-Ray Photoelectron Spectroscopy (XPS)>

The atomic composition percentages of the silicon material surface were measured by X-ray photoelectron spectroscopy. Measurement was performed using AXIS Nova manufactured by Kratos Analytical Ltd. Al-Kα rays were used as the X-ray excitation source, using a 150 W monochromator and an analysis area of 0.4 mm×0.9 mm. By survey scan measurement, the peak areas of C1s, O1s, N1s, and F1s were determined, and after correction by the relative sensitivity of XPS for each element, the atomic composition percentages were determined. The proportion of C atoms and the ratio of C atoms relative to Si atoms were determined from the obtained atomic composition percentage values.

<Preparation of Curable Silicone Composition>

The curable silicone compositions (parts by mass) shown in Table 1 were prepared using the components mentioned below. Moreover, in Table 1, the content of component (C) is expressed in terms of the content (ppm in terms of mass units) of platinum metal relative to the curable silicone composition. Moreover, in Table 1, "SiH/Vi" represents the value of the number of moles of silicon-bonded hydrogen atoms in component (B) per 1 mole of vinyl groups in component (A) in the curable silicone composition. Note that in the formulae, Me, Ph, Vi, and Ep represent a methyl group, a phenyl group, a vinyl group, and a 3-glycidoxypropyl group, respectively.

The following components were used as component (A).

Component (a-1): an organopolysiloxane represented by the following average composition formula:

$$Me_{1.62}Vi_{0.06}Ph_{0.26}SiO_{1.03}$$

(vinyl group content=3.1 mol %, phenyl group content=13.4 mol %)

Component (a-2): an organopolysiloxane represented by the following average composition formula:

$$Me_{1.14}Vi_{0.14}Ph_{0.26}SiO_{1.22}$$

(vinyl group content=9.1 mol %, phenyl group content=16.9 mol %)

Component (a-3): an organopolysiloxane represented by the following average composition formula:

$$Me_{1.17}Vi_{0.13}Ph_{0.23}SiO_{1.23}$$

(vinyl group content=8.5 mol %, phenyl group content=15.0 mol %)

Component (a-4): an organopolysiloxane represented by the following average composition formula:

$$Me_{0.94}Vi_{0.18}Ph_{0.44}SiO_{1.22}$$

(vinyl group content=11.5 mol %, phenyl group content=28.2 mol %)

Component (a-5): an organopolysiloxane represented by the following average composition formula:

$$Me_{0.68}Vi_{0.34}Ph_{0.73}SiO_{1.11}$$

(vinyl group content=19.4 mol %, phenyl group content=41.7 mol %)

Component (a-6): an organopolysiloxane represented by the following average composition formula:

$$Me_{1.78}Vi_{0.04}SiO_{1.09}$$

(vinyl group content=2.2 mol %)

The following components were used as component (B).

Component (b-1): an organopolysiloxane resin represented by the following average unit formula:

$$(Me_2HSiO_{1/2})_{0.65}(SiO_{4/2})_{0.35}$$

Component (b-2): an organotrisiloxane represented by the following formula:

$$HMe_2SiOPh_2SiOSiMe_2H$$

Component (b-3): an organopolysiloxane resin represented by the following average unit formula:

$$(Me2HSiO_{1/2})_{0.6}(PhSiO_{3/2})_{0.4}$$

Component (b-4): an organopolysiloxane represented by the following formula:

$$Me_3SiO(MeHSiO)_{50}SiMe_3$$

The following component was used as component (C).

Component (c-1): a solution of a platinum-1,3-divinyl-1,1,3,3-tetramethyldisiloxane complex in 1,3,5,7-tetramethyl-1,3,5,7-tetravinylcyclotetrasiloxane (the solution contains 0.1 mass % of platinum)

The following components were used as component (D).

Component (d-1): 1,3,5,7-tetramethyl-1,3,5,7-tetravinylcyclotetrasiloxane

Component (d-2): 1-ethynylcyclohexanol

The following components were used as component (E).

Component (e-1): an adhesion-imparting agent having a viscosity at 25° C. of 30 mPa·s and comprising a condensation reaction product of 3-glycidoxypropyltrimethoxysilane and a methylvinylsiloxane oligomer capped at both molecular terminals with silanol groups Component (e-2): an adhesion-imparting agent composed of an organopolysiloxane resin represented by the following average unit formula:

$$(Me_2ViSiO_{1/2})_{0.18}(MeEpSiO_{2/2})_{0.28}(PhSiO_{3/2})_{0.54}$$

The obtained curable silicone compositions 1 to 6 were each cured by heating for 5 minutes with a 120° C. hot press and then further heating for 1 hour in a 150° C. oven, to produce silicone materials 1 to 6. The elemental composition ratios of the surfaces of these silicone materials were measured by X-ray photoelectron spectroscopy. Furthermore, the presence or absence of Si—$C_2H_4$—Si bonds in the structure of the silicone material was ascertained by $^{13}C$ nuclear magnetic spectroscopy. Those results are shown in Table 1.

TABLE 1

| | | Category Type of curable silicone composition | | | | | |
|---|---|---|---|---|---|---|---|
| | | 1 | 2 | 3 | 4 | 5 | 6 |
| Composition of curable silicone Composition (parts by mass) | Component (a-1) | 90.95 | — | — | — | — | — |
| | Component (a-2) | — | 79.56 | — | — | — | — |
| | Component (a-3) | — | — | 75.30 | — | — | — |
| | Component (a-4) | — | — | — | 77.41 | — | — |
| | Component (a-5) | — | — | — | — | 75.10 | — |
| | Component (a-6) | — | — | — | — | — | 95.10 |
| | Component (b-1) | 8.05 | — | — | — | — | — |
| | Component (b-2) | — | 18.01 | 17.36 | 18.75 | 20.00 | — |
| | Component (b-3) | — | — | — | — | 2.40 | — |
| | Component (b-4) | — | — | — | — | — | 4.20 |
| | Component (c-1) | 2.5 ppm | 2.5 ppm | 2.5 ppm | 2.5 ppm | 2.5 ppm | 2.5 ppm |
| | Component (d-1) | 0.49 | 1.31 | 1.31 | 1.81 | 0.20 | — |
| | Component (d-2) | 0.03 | 0.02 | — | — | — | — |
| | Component (e-1) | 0.50 | — | — | — | — | 0.50 |
| | Component (e-2) | — | — | 2.00 | 2.00 | 2.40 | — |
| | SiH/Vi | 1.3 | 0.8 | 0.9 | 0.8 | 0.6 | 1.3 |
| Characteristics of silicone material | Ratio of elemental Composition percentage of carbon atoms to elemental | 3.4 | 3.5 | 3.4 | 4.2 | 5.6 | 1.8 |

TABLE 1-continued

| | Category Type of curable silicone composition | | | | | |
|---|---|---|---|---|---|---|
| | 1 | 2 | 3 | 4 | 5 | 6 |
| composition percentage of silicon atoms (C/Si) | | | | | | |
| Elemental composition percentage of carbon atoms (atom %) | 63.0 | 61.9 | 61.5 | 66.7 | 73.0 | 46.7 |
| Presence or absence of Si—C$_2$H$_4$—Si bond | Present | Present | Present | Present | Present | Present |

Working Example 1

A ceramic LED substrate in which an LED chip was mounted on a ceramic substrate was placed in a compression molder. Curable silicone composition 1 was poured into the die cavity, and dome-shape sealing material was formed on the LED chip by hot compression molding for 5 minutes at 120° C. Curing was additionally performed for 1 hour at 150° C., and an LED device was produced. Current of 700 mA was made to flow through the obtained LED device in a thermo-hygrostatic oven at 85° C. and 85% RH, and a power-on test was conducted. No drop in LED brightness (drop to 90% or less of the initial brightness in the power-on test) due to decrease in transparency of the sealing material and no cracking was observed in the silicone material within the stipulated time period (50 hrs.).

Working Example 2

An LED device was produced and a power-on test was conducted in the same manner as Working Example 1 using curable silicone composition 2. No drop in LED brightness due to decrease in transparency of the sealing material and no cracking in the silicone material was observed within the stipulated time period (50 hrs.).

Working Example 3

An LED device was produced and a power-on test was conducted in the same manner as Working Example 1 using curable silicone composition 3. No drop in LED brightness due to decrease in transparency of the sealing material and no cracking in the silicone material was observed within the stipulated time period (50 hrs.).

Working Example 4

An LED device was produced and a power-on test was conducted in the same manner as Working Example 1 using curable silicone composition 4. No drop in LED brightness due to decrease in transparency of the sealing material and no cracking in the silicone material was observed within the stipulated time period (50 hrs.).

Comparative Example 1

An LED device was produced and a power-on test was conducted in the same manner as Working Example 1 using curable silicone composition 5. The brightness of the LED device dropped due to decrease in transparency of the sealing material within the stipulated time period (50 hrs.).

Comparative Example 2

An LED device was produced and a power-on test was conducted in the same manner as Working Example 1 using curable silicone composition 6. However, cracking occurred in the silicone material within the stipulated time period (50 hrs.).

INDUSTRIAL APPLICABILITY

Since the silicone material of the present invention is stable against light and heat and a decrease in transmittance and generation of cracks do not tend to occur, it is advantageous as an LED sealing material in which high durability at high brightness is demanded.

DESCRIPTION OF SYMBOLS

1 Substrate
2 LED
3 Silicone material
4, 4' Lead frame
5 Bonding wire
6 Light reflection material

The invention claimed is:

1. A silicone material satisfying any of the following conditions in an elemental composition percentage of the silicone material surface according to X-ray photoelectron spectroscopy (ESCA):
   (i) the elemental composition percentage of carbon atoms is from 50.0 to 70.0 atom %;
   (ii) a ratio of the elemental composition percentage of carbon atoms to the elemental composition percentage of silicon atoms (C/Si) is from 2.0 to 5.0; or
   (iii) both of the above conditions (i) and (ii).

2. The silicone material according to claim 1, wherein the silicone material contains an Si—R$^1$—Si bond in the structure, where R$^1$ is an alkylene group or an arylene group.

3. The silicone material according to claim 1, wherein the silicone material is an optical material.

4. The silicone material according to claim 1, wherein the silicone material is a sealing material of an optical element.

5. A curable silicone composition which cures to form the silicone material according to claim 1, the composition comprising: an organopolysiloxane having at least two silicon-bonded alkenyl groups and at least one silicon-bonded aryl group in a molecule; an organopolysiloxane having at least two silicon-bonded hydrogen atoms in a molecule; and a hydrosilylation-reaction catalyst.

6. An optical device formed by sealing an optical element with the silicone material according to claim 1.

7. The optical device according to claim 6, wherein the optical element is an LED.

8. The optical device according to claim 7, wherein the optical device is a chip-on-board LED device.

9. The silicone material according to claim 2, wherein $R^1$ is an alkylene group and the alkylene group is a methylmethylene group, an ethylene group, a propylene group, a methylethylene group, a butylene group, or an isobutylene group.

10. The silicone material according to claim 2, wherein $R^1$ is an arylene group and the arylene group is a phenylene group, a tolylene group, a xylylene group, or a naphthylene group.

11. The curable silicone composition according to claim 5, the composition comprising:

(A) an organopolysiloxane represented by the average composition formula:

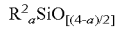

$$R^2_a SiO_{[(4-a)/2]}$$

wherein $R^2$ are each independently an alkyl group having from 1 to 12 carbons, an alkenyl group having from 2 to 12 carbons, an aryl group having from 6 to 20 carbons, or an aralkyl group having from 7 to 20 carbons, wherein alkenyl groups account for 1 to 20 mol % of all $R^2$, aryl groups account for at most 40 mol % of all $R^2$, and "a" is a number satisfying the relationship $1 \leq a < 2$;

(B) an organopolysiloxane having at least two silicon-bonded hydrogen atoms in the molecule, in an amount such that the amount of silicon-bonded hydrogen atoms in this component is from 0.1 to 5 moles per 1 mole of total alkenyl groups in component (A); and (C) a hydrosilylation reaction catalyst.

12. The curable silicone composition according to claim 11, wherein component (A) has a dendritic molecular structure.

* * * * *